United States Patent [19]

Masumoto et al.

[11] Patent Number: 5,319,658
[45] Date of Patent: Jun. 7, 1994

[54] SOLID SOLUTION SEMICONDUCTOR LASER ELEMENT MATERIAL AND LASER ELEMENT

[75] Inventors: Katashi Masumoto; Katsumi Mochizuki; Seishi Abe, all of Sendai, Japan

[73] Assignee: The Foundation: The Research Institute of Electric and Magnetic Alloys, Japan

[21] Appl. No.: 997,934

[22] Filed: Dec. 29, 1992

[30] Foreign Application Priority Data

Jan. 9, 1992 [JP] Japan ................................. 4-002307

[51] Int. Cl.$^5$ ............................................... H01S 3/19
[52] U.S. Cl. .......................................... 372/43; 372/45
[58] Field of Search ................. 372/89, 43, 45, 50; 252/301.17; 204/157.41

[56] References Cited

U.S. PATENT DOCUMENTS

| | | | |
|---|---|---|---|
| 4,612,644 | 9/1986 | Partin | 372/45 |
| 4,722,087 | 1/1988 | Partin | 372/44 |
| 5,119,388 | 6/1992 | Feit et al. | 372/50 X |

FOREIGN PATENT DOCUMENTS 0385668  9/1990  European Pat. Off. ............. 372/50

OTHER PUBLICATIONS

Smith & Woodall, IBM Technical Disclosure Bulletin, Apr. 1974, vol. 16 No. 11, pp. 3808–3809.
Abe, Mochizuki, Masumoto, Journal of the Japan Institute of Metals vol. 56, No. 12, pp. 1479–1484, Dec. 1992, Abstract Only.
"Lead Calcium Telluride Grown by Molecular Beam Epitaxy", D. L. Partin et al., J. Vac. Sci, Technol. B 4(2), Mar./Apr. 1986, pp. 578–580.
"Lead Strontium Sulfide and Lead Calcium Sulfide, Two New Alloy Semiconductors", H. Holloway et al., The Am. Phys. Soc., pp. 5617–5622, Nov. 15, 1982.
Journal of Crystal Growth 81 (1987) 400–404 North-Holland, Amsterdam Double Heterostructure . . . N. Koguchi et al.
Superlattices and Microstructures, vol. 1, No. 2, 1985 Lead Salt Quantum Well Diode Lasers Dale L. Partin, pp. 131–135.
Appl. Phys. Lett. 55 (5), Jul. 31, 1989 American Institute of Physics Pb1–xSrxS/PbS Double-Heterostructure Lasers . . . A. Ishida et al, pp. 430–431.
Appl. Phys. Lett. 53 (26), Dec. 26, 1988 American Institute of Phys. Near-room-temperature Operation of Pb1–xSrxSe . . . B. Spranger et al, pp. 2582–2583.

Primary Examiner—John D. Lee
Assistant Examiner—Hemang Sanghavi
Attorney, Agent, or Firm—Parkhurst, Wendel & Rossi

[57] ABSTRACT

The present invention relates to a solid solution semiconductor laser element material which can form a laser element which oscillates in an infrared region of wavelength 0.2–8 μm, varies wavelength and is operable in the vicinity of room temperature, particularly a laser element of a lattice-matching double hetero junction or lattice-matching quantum well structure. The disclosed solid state semiconductor is made of a material selected from a material having the general chemical formula $$Ca_{1-x}Pb_xX$$

where, $0 < x < 0.5$ and X is at least one element selected from S, Se and Te, a material having the general chemical formula $$Ca_{1-x}(Pb_{1-y}Y_y)_xX$$

where, $0 < x \leq 0.5$, $0 < y < 1$, X is at least one element selected from S, Se and Te and Y is at least one element selected from Zn and Mn, and a material having the general chemical formula $$Ca_{1-x}Pb_xS_{1-z}Se_z$$

where, $< x \leq 0.4$ and $0 \leq z \leq 1$.

17 Claims, 3 Drawing Sheets

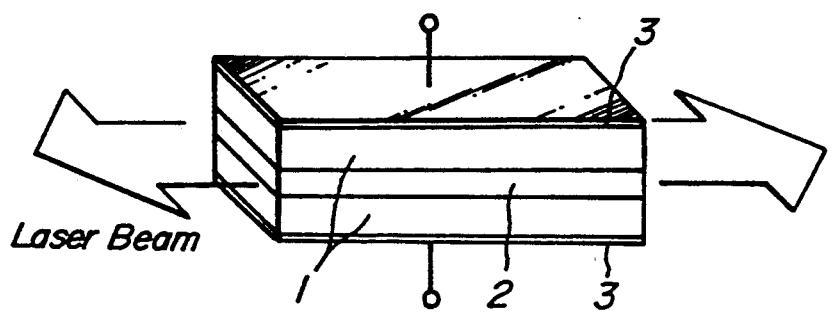
FIG_1A
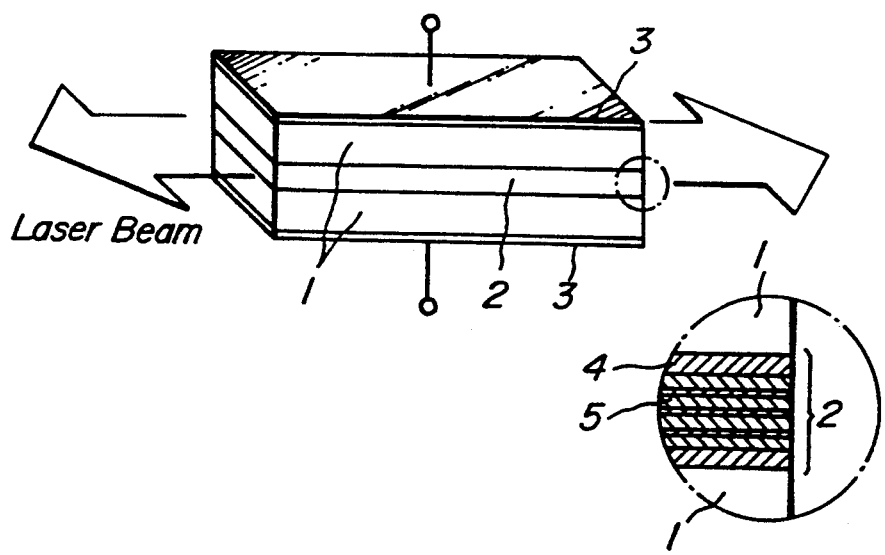
FIG_1B
FIG_1C

FIG._2
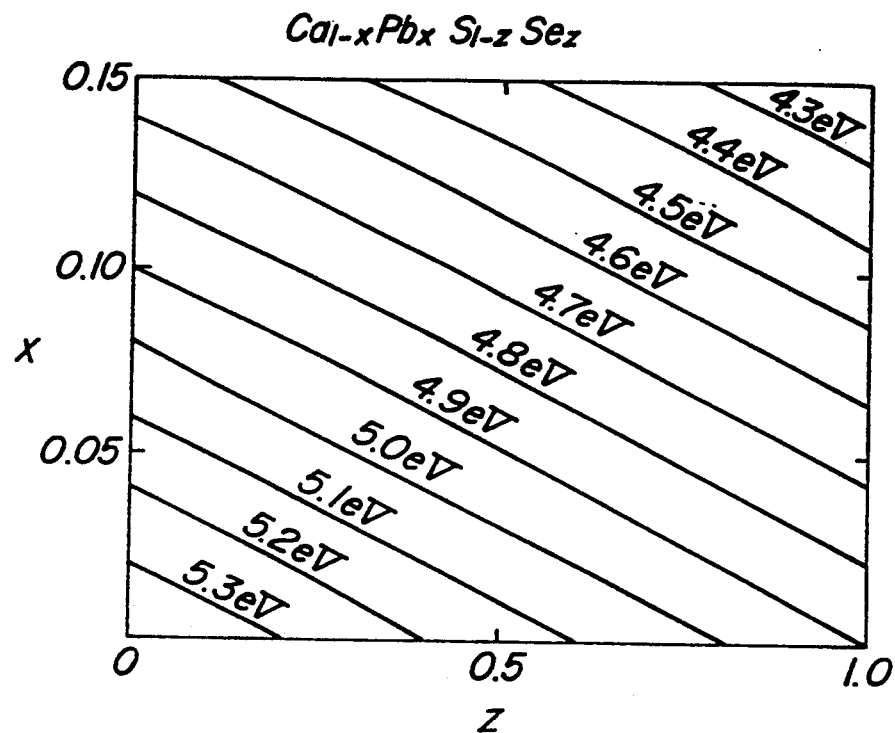
FIG._3
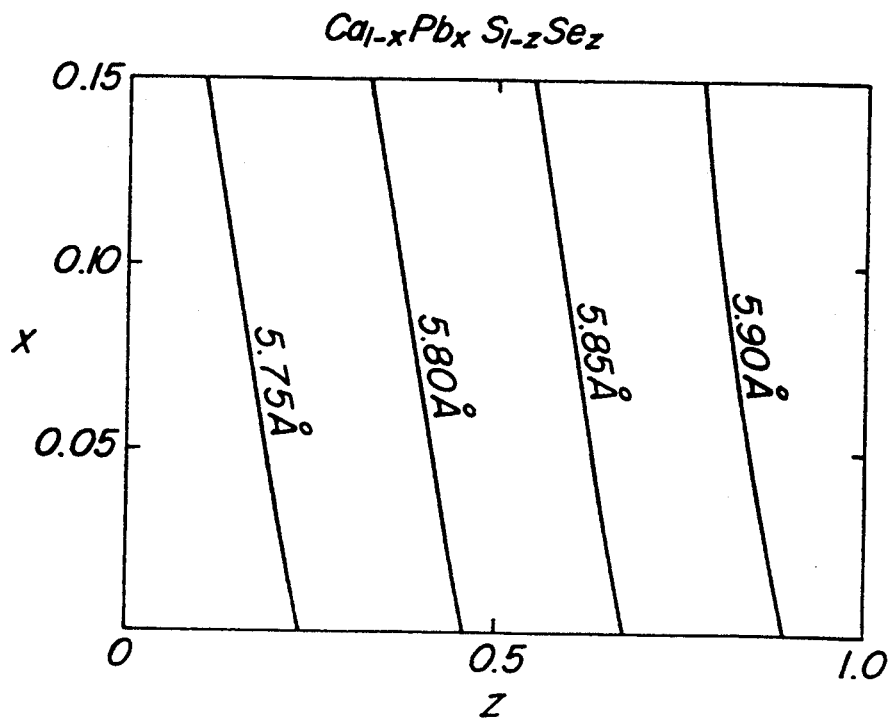

FIG_4
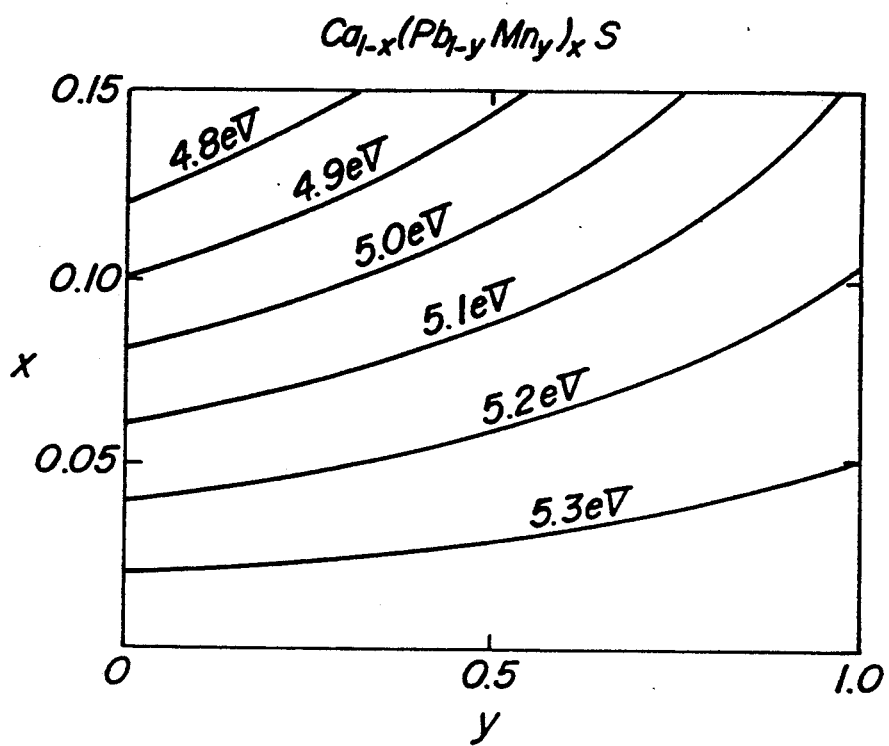
FIG_5
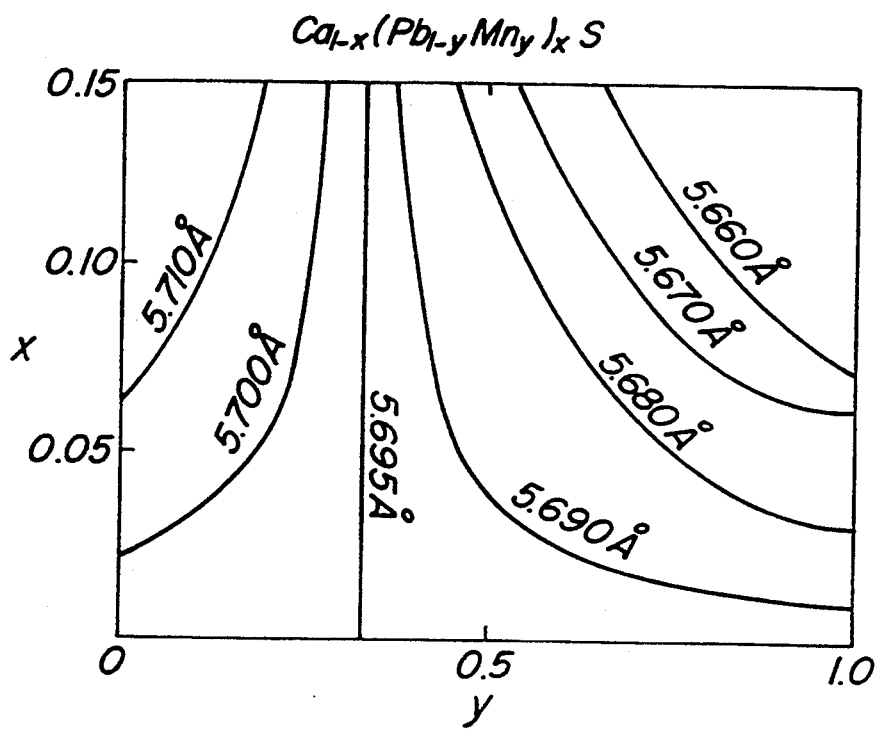

SOLID SOLUTION SEMICONDUCTOR LASER ELEMENT MATERIAL AND LASER ELEMENT

BACKGROUND OF THE INVENTION

1. Field of the Invention

The present invention relates to a solid solution semiconductor laser element material consisting of a solid solution semiconductor having the general chemical formulae $Ca_{1-x}Pb_xX$ (wherein $0<x<0.5$, X is at least one element selected from S, Se and Te) and $Ca_{1-x}(Pb_{1-y}Y_y)_xX$ (wherein $0<x\leq0.5$, $0<y<1$, X is at least one element selected from S, Se and Te), oscillating within a wide region of wavelength 0.2-8 μm and being operable in the vicinity of room temperature, and a laser element with the use of this material. An object of the invention is to provide a laser element which is capable of oscillating within a region of wavelength 0.2-8 μm, varying wavelength and being operable in the vicinity of room temperature, particularly a solid solution semiconductor laser element material which can form a laser element which is capable of having a lattice matching type double hetero junction structure or lattice matching type quantum well structure.

2. Description of the Prior Art

The structure of a semiconductor laser element is explained by referring to FIG. 1. FIGS. 1(A), 1(B) and 1(C) show a lattice matching type double hetero junction structure laser element, a lattice matching type quantum well structure laser element and its partly enlarged view, respectively, and a laser beam is emitted from an active layer 2 sandwiched by cladding layers 1, 1 in the arrow direction by flowing a current through electrodes 3, 3.

In the case of the semiconductor, laser element, a laser beam emitted therefrom is faint is different that emitted from the other gas lasers and the like. Accordingly, to increase luminous efficiency of the laser element a complicated structure has been developed which divides an active layer 2 into a barrier layer 4 and a quantum well 5 as shown in FIG. 1(B).

As a task required for the above-described semiconductor laser, it is important to increase an operating temperature and to have good junction between a cladding layer 1 and active layer 2.

Hitherto, as wavelength variable semiconductor laser element materials within a region of wavelength 0.2-8 μm, there have been known $Hg_{1-x}Cd_xTe$ where $0<x\leq1$ as a II-VI group compound semiconductor and InAs or InSb as a III-V group compound semiconductor and each kind of IV-VI group compound semiconductors. Among them, the IV-VI group compound semiconductor is noted as the most practically usable material from the point of a high operating temperature and large wavelength variation, and $Pb_{1-x}Cd_xS_{1-y}Se_y$ or $Pb_{1-x}Eu_xTe_{1-y}Se_y$ as a quaternary lead salt solid solution semiconductor has hitherto been known.

A laser element is usually formed with a double hetero junction structure substantially matching lattice constants of an active layer 2, a charge carrier, and a light beam cladding layer, wherein the cladding layer 1 is made $Pb_{1-x}Cd_xS_{1-y}Se_y$ or $Pb_{1-x}Eu_xSe_yTe_{1-y}$, and the active layer 2 is made PbS or $Pb_{1-x'}Eu_{x'}Se_{y'}Te_{1-y'}$, respectively. Operating temperatures are 200 K and 270 K, respectively, but only attained by pulse oscillation, and if the pulse oscillation becomes continuous oscillation, operating temperatures are further disadvantageously lowered in the continuous oscillation and cannot practically be used.

Generally, in order to increase the operating temperature of the above injection type semiconductor laser, it is desired to form a laser element with a lattice matching type double hetero junction structure or lattice matching type quantum well structure matching each lattice constant of active layer, a charge carrier and beam cladding layer. It is further greatly desired to make an energy gap of the cladding layer 1 larger than that of the active layer 2 and to make its difference sufficient, but in either one of $Pb_{1-x}Cd_xS_{1-y}Se_y$ or $Pb_{1-x}Eu_xSe_yTe_{1-y}$, the difference is small, and as a result, an operating temperature is disadvantageously low.

In case of forming a laser element with a lattice-matching type double hetero junction structure or lattice-matching type quantum well structure, it is necessary to make an energy gap of the cladding layer 1 larger than that of the active layer 2, to make its difference large and to form a laser element with joining materials which crystalline structures and lattice constants are substantially the same. In $Pb_{1-x}Cd_xS_{1-y}Se_y$ or $Pb_{1-x}Eu_xSe_yTe_{1-y}$ of a quaternary solid solution having a rock salt-type crystalline structure, materials having different energy gaps and substantially equal lattice constants can be obtained by controlling a composition x of Cd or Eu and a composition y of Se, respectively, so that a laser element can be formed by joining them.

However, in case of actually manufacturing a laser element, a large solid solution amount of Pb cannot be expected because of limitations such as a manufacturing condition and the like, and a quaternary solid solution is manufactured by a small amount of solid solution at present. Materials pulse oscillated at 200 K and 270 K as described above are understood that compositions x of Cd and Eu in the above-described quaternary solid solution are 0.05 and 0.018, respectively, and that a solid solution amount to Pb is small. Therefore, in case of using them as a beam cladding layer 1, energy gap difference between the cladding layer 1 and the active layer 2 is at most 0.18 (eV) at 300 K and 0.094 (eV) at 241 K, and a laser element having a high operating temperature could not be obtained.

The demand for high-performance laser elements has recently been increased more and more, particularly the development of solid solution semiconductor laser element material operable in the vicinity of room temperature is important. That is, in order to increase the operating temperature of a semiconductor laser, it is an urgent task to obtain a novel solid solution semiconductor having larger energy gap of the cladding layer than that of the active layer and a sufficiently large difference therebetween.

SUMMARY OF THE INVENTION

The present invention is to obviate the aforementioned shortcoming and to be made by taking the above into consideration. The present inventors have made expensive studies variously and have discovered that the aforementioned problems can be solved by solid solving lead (Pb) into calcium (Ca). The characteristics of the present invention are as follows.

An object of the invention is to provide a solid solution semiconductor laser element material having the general chemical formula $Ca_{1-x}Pb_xX$ where $0 < x < 0.5$ and X is at least element selected from the group consisting of S, Se and Te.

Another object of the invention is to provide a solid solution semiconductor laser element material having the general chemical formula $$Ca_{1-x}(Pb_{1-y}Y_y)_xX$$

where, $0 < x \leq 0.5$, $0 < y < 1$ and X is at least one element selected from the group consisting of S, Se and Te and Y is at least one element selected from the group consisting of Zn and Mn.

Still another object of the invention is to provide a solid solution semiconductor laser element material having the general chemical formula $$Ca_{1-x}Pb_xS_{1-z}Se_z$$

where, $0 < x \leq 0.4$ and $0 \leq z \leq 1$.

Yet still another object of the invention is to provide a solid solution semiconductor laser element material having the general chemical formula $$Ca_{1-x}(Pb_{1-y}Mn_y)_xS$$

where, $0 < x \leq 0.5$ and $0 \leq y < 1$.

Another object of the invention is to provide a laser element, wherein the material of said laser element is used as a cladding layer and/or active layer.

Another object of the invention is to provide a double hetero junction structure laser element, wherein the material of said laser element is used as a cladding layer and/or active layer.

Another object of the invention is to provide a quantum well structure laser element, wherein the material of said laser element is used as a cladding layer and/or active layer.

BRIEF DESCRIPTION OF THE DRAWINGS

For a better understanding of the invention, reference is made to the accompanying drawings, in which:

FIG. 1(A) is a laser element having a lattice-matching type double hetero junction structure.

FIG. 1(B) is a laser element having a lattice-matching quantum well structure.

FIG. 1(C) is a partly enlarged view of the element.

FIG. 2 is a diagram showing the relation between compositions x and z of $Ca_{1-x}Pb_xS_{1-z}Se_z$ and the energy gap at room temperature.

FIG. 3 is a diagram showing the relation between compositions x and z of $Ca_{1-x}Pb_xS_{1-z}Se_z$ and the lattice constant at room temperature.

FIG. 4 is a diagram showing the relation between compositions x and y of $Ca_{1-x}(Pb_{1-y}Mn_y)_xS$ and the energy gap at room temperature.

FIG. 5 is a diagram showing the relation between compositions x and y of $Ca_{1-x}(Pb_{1-y}Mn_y)_xS$ and the lattice constant at room temperature.

DESCRIPTION OF THE PREFERRED EMBODIMENTS

A method of manufacturing a solid solution semiconductor according to the present invention is explained in detail. Each element is weighed at a desired composition ratio, and sealed in a suitable vessel, such as a quartz vessel, in vacuo or a suitable gas atmosphere.

The vessel is inserted in a suitable heating furnace, such as an electric furnace, homogeneously heated and melted, and thereafter water quenched. The sample is ground for further homogenization, and thereafter again sealed in a suitable vessel, such as a quartz vessel, in vacuo or a suitable gas atmosphere, heated at a high temperature for suitable hours, and water quenched, thereby obtaining a homogeneous solid-solved material. The thus obtained material is formed into a single crystal by a single crystal manufacturing method, such as a Bridgeman method, vapor-phase method and the like. Then, the material is manufactured into a thin film having suitable thickness by using a thin film manufacturing device, such as an MBE method, Hot Wall method and the like.

For a better understanding of the present invention, the present invention is explained by referring to the accompanying drawings. FIG. 2 shows the characteristic diagram of the relation between the energy gap at room temperature and the composition of x and z of $Ca_{1-x}Pb_xS_{1-z}Se_z$. FIG. 3 shows the characteristic diagram of relation between composition of x and z of $Ca_{1-x}Pb_xS_{1-z}Se_z$ and the lattice constants at room temperature Obtained by an X-ray powder diffraction method with respect to single crystals of $Ca_{1-x}Pb_xS_{1-z}Se_z$, and FIGS. 4 and 5 show those with respect to crystals of $Ca_{1-x}(Pb_{1-y}Mn_y)_xS$, respectively. Moreover, both the energy gap and the lattice constant are the value at room temperature.

It is possible from these drawings to select a combination of materials which energy gaps are large so as to have a large difference, and moreover lattice constants are equal. That is, a combination of materials as a charge carrier, a beam cladding layer add an active layer in a lattice-matching type double hetero junction structure laser element or a lattice matching type quantum well structure laser element. For example, FIG. 1 shows that, in case of a combination of $Ca_{0.98}Pb_{0.02}Se$ and PbS, lattice constants become equal, and a large difference of energy gaps such as 4.4 eV is obtained. Therefore, the present invention can manufacture a lattice matching type double hetero junction structure laser element or a lattice matching type quantum well structure laser element which oscillates within a region of wavelength 0.2–8 μm, can vary wavelength and can be operable at a temperature in the vicinity of room temperature.

EXAMPLE 1

With respect to a solid solution semiconductor of $Ca_{1-x}Pb_xS_{1-z}Se_z$ ($x = 0.02$–$0.04$, $z = 0.2$–$0.8$), raw materials of granular Ca, Pb, S and Se of 99.999% purity were weighed to be gross weight of 2 g at a desired composition ratio. The raw materials were vacuum sealed in a quartz vessel of 8 mm in inner diameter and 40 mm in length under vacuum of $1 \times 10^{-6}$ Torr, and a synthetic reaction was preliminarily progressed with a weak oxygen-hydrogen flame. Thereafter, the vessel was inserted into an electric furnace heated to 1127 K, maintained for about 10 minutes, then increased a temperature to 1393 K at a rate of 50 K/hr, maintained at the same temperature for 3 hours, homogeneously melted, and water quenched. The thus obtained material was ground in a mortar, vacuum sealed in a clean vessel of 8 mm in inner diameter and 50 mm in length, and placed at one end. In order to prevent the temperature distribution from disturbance caused by the flow within a furnace, the vessel was further vacuum sealed in a big quartz vessel, and a double sealed structure is formed. This vessel was placed in a furnace (such as horizontal furnace) holding a sample temperature of about 1223 K and a temperature gradient of a temperature difference 4K from a crystal growth portion, left for several days to single crystallize, thereafter water-quenched to form a solid solution semiconductor laser element material. In table 1 are shown energy gaps and lattice constants of each of the thus obtained solid solution semiconductors. These values are well matched with energy gaps and lattice constants shown in FIGS. 2 and 3.

TABLE 1

| No. | Composition | | Energy gap (eV) | Lattice constant (Å) |
|---|---|---|---|---|
| | x | z | | |
| 3 | 0.02 | 0.2 | 5.20 | 5.697 |
| 7 | 0.04 | 0.2 | 5.10 | 5.699 |
| 9 | 0 02 | 0.5 | 5.05 | 5.692 |
| 13 | 0.02 | 0.8 | 4.91 | 5.689 |
| 17 | 0.04 | 0.8 | 4.81 | 5.681 |

EXAMPLE 2

With respect to five kinds of a solid solution semiconductor of $Ca_{1-x}(Pb_{1-y}Mn_y)_xS$ (x=0.03–0.5, y=0.07–0.62), raw materials of granular Ca, Pb, Mn and S of 9.999% purity were weighed to be gross weight of 2 g at a desired composition ratio. A method of manufacturing a sample is the same as that of Example 1. Energy gaps and lattice constants of each of the thus obtained solid solution semiconductors are as shown in Table 2. These values are well matched with energy gaps and lattice constants shown in FIGS. 4 and 5.

TABLE 2

| No. | Composition | | Energy gap (eV) | Lattice constant (Å) |
|---|---|---|---|---|
| | x | y | | |
| 6 | 0.03 | 0.07 | 5.26 | 5.700 |
| 10 | 0.05 | 0.22 | 5.18 | 5.700 |
| 12 | 0.03 | 0.42 | 5.29 | 5.695 |
| 18 | 0.05 | 0.42 | 5.21 | 5.695 |
| 24 | 0.03 | 0.62 | 5.31 | 5.690 |

Table 3 shows various properties when typical solid solution semiconductor laser element materials obtained by the present invention are used for a laser element cladding layer and/or active layer. Lattice constants of the cladding layer and the active layer are well-matched, and their energy gap difference is large. That is, it is understood that the difference is remarkably improved as compared with a comparative example having the highest value of 0.18 (eV) obtained by the prior art.

TABLE 3

| No. | Cladding layer | | | Active layer | | |
|---|---|---|---|---|---|---|
| | Composition | Gap energy (eV) | Lattice constant (Å) | Composition | Gap energy (eV) | Lattice constant (Å) |
| 33 | $Ca_{0.93}Pb_{0.07}S_{0.01}Se_{0.99}$ | 4.58 | 5.936 | PbS | 0.41 | 5.936 |
| 78 | $Ca_{0.92}Pb_{0.02}Mn_{0.06}S$ | 5.20 | 5.668 | ZnSe | 2.60 | 5.668 |
| 46 | CaSe | 4.90 | 5.924 | $Ca_{0.95}Pb_{0.05}S_{0.04}Se_{0.96}$ | 4.69 | 5.924 |
| 50 | CaS | 5.40 | 5.695 | $Ca_{0.95}Pb_{0.03}Mn_{0.02}S$ | 5.20 | 5.695 |
| 54 | $Ca_{0.98}Pb_{0.02}S_{0.34}Se_{0.66}$ | 4.98 | 5.850 | $Ca_{0.93}Pb_{0.07}S_{0.38}Se_{0.62}$ | 4.76 | 5.850 |
| 60 | $Ca_{0.97}Pb_{0.02}Mn_{0.01}S$ | 5.28 | 5.695 | $Ca_{0.90}Pb_{0.07}Mn_{0.03}S$ | 5.00 | 5.695 |
| 63 | $Ca_{0.95}Pb_{0.05}Se_{0.56}Te_{0.44}$ | 4.34 | 6.124 | PbSe | 0.28 | 6.124 |
| 71 | $Ca_{0.85}Pb_{0.03}Zn_{0.12}S$ | 5.03 | 5.668 | ZnSe | 2.60 | 5.668 |
| 76 | $Ca_{0.98}Pb_{0.02}S_{0.43}Se_{0.56}Te_{0.01}$ | 5.01 | 5.936 | PbS | 0.41 | 5.936 |
| 86 | $Ca_{0.92}Pb_{0.01}Mn_{0.06}Zn_{0.01}S$ | 5.20 | 5.668 | ZnSe | 2.60 | 5.668 |
| Comparative Example | $Pb_{0.95}Cd_{0.05}S_{0.89}Se_{0.11}$ | 0.59 | 5.936 | PbS | 0.41 | 5.936 |

As shown in the above examples, tables and drawings, the solid solution semiconductor laser element material of the present invention is wide in solid solution range nd large in energy gap so as to be a suitable material for laser elements. That is, it is possible to manufacture a laser element having a high operating temperature and high luminous efficiency by using the material of the present invention as a cladding layer, and suitably selecting a solid solution semiconductor having a smaller energy gap than that of the cladding layer, a large difference thereof, substantially equal lattice constant and well-matching lattice alignment, such as PbS, PbSe, PbTe, $PbS_{1-z}Se_z$ and the like as an active layer, or by suitably selecting a solid solution semiconductor having a large energy gap, such as CaSe, CaS and the like as a cladding layer and suitably selecting the material of the present invention having a smaller energy gap than that of the cladding layer, a large difference thereof and well-matching lattice alignment as an active layer. Further, it is possible to manufacture a laser element having a high operating temperature and high luminous efficiency by suitably selecting the material of the present invention having a larger energy gap of the cladding layer than that of the active layer, a large difference thereof, and well-matching lattice alignment as both the cladding layer and the active layer. Therefore, the laser element of the present invention is suitable for not only a light source of a superhigh resolution spectroscope within a region of wavelength 0.2–8 μm or quartz glass fiber optical communication, but also a light source of optical communication with the use of a metal halide polar loss glass fiber having less optical loss now in development. Moreover, when lattices cannot align at an interface of the active layer and the cladding layer of the laser element, crystal defect such as dislocation is introduced into the active layer, luminous efficiency is lowered, and performance of the laser element is deteriorated, so that it is desirable that lattice constants of the cladding layer and the active layer are substantially equal and alignment is good.

The reason why the general chemical formulae of the material of the present invention are limited to $Ca_{1-x}Pb_xX$ (where, $0<x<0.5$, X: at least one element selected from S, Se and Te) and $Ca_{1-x}(Pb_{1-y}Y_y)_xX$ (where, $0<x\leq0.5$, $0<y<1$, X: at least one element selected from S, Se and Te, Y: at least one element selected from Zn and Mn) is because if the material deviates from these composition ranges, the manufacture of a laser element becomes difficult, an operating temperature and luminous efficiency are lowered, and it is unsuitable as laser element material. However, if a solid solution semiconductor is obtained even though there is some deviation from the above stoichiometric composition, properties as a laser element material are not spoiled and the material belongs to the category of the present invention. Moreover, an element of Ca of the present material is remarkably effective for widening a solid solution range with Pb and enlarging energy gap, and elements of Zn, Mn, S, Se and Te are largely effective for controlling lattice constant of a solid solution semiconductor.

The material of the present invention can easily form a laser element, particularly a lattice matching-type double hetero junction or lattice matching-type quantum well structure laser element which oscillates within a range of wavelength 0.2–8 $\mu$m, varies wavelength and is operable in the vicinity of a room temperature, so that it is suitable as material of a laser element having high luminous efficiency and high performance, and this laser element is further suitable as a light source of optical communication system, superhigh resolution spectroscope and other general instruments, and its applicable range is wide.

What is claimed is:

1. A solid solution semiconductor laser element material having the general chemical formula $$Ca_{1-x}Pb_xX$$

wherein $0<x<0.5$ and X comprises S.

2. A material according to claim 1, wherein X further comprises at least one of Se and Te.

3. A laser element including a cladding layer and an active layer, wherein at least one of said layers comprises the material of claim 1.

4. A double hetero junction laser element including a cladding layer and an active layer, wherein at least one of said layers comprises the material of claim 1.

5. A quantum well structure laser element including a cladding layer and an active layer, wherein at least one of said layers comprises the material of claim 1.

6. A solid solution semiconductor laser element material having the general chemical formula $$Ca_{1-x}(Pb_{1-y}Y_y)_xX$$

wherein $0<x\leq0.5$, $0<y<1$, X is at least one element selected from S, Se and Te and Y is at least one element selected from Zn and Mn.

7. A laser element including a cladding layer and an active layer, wherein at least one of said layers comprises the material of claim 6.

8. A double hetero junction laser element including a cladding layer and an active layer, wherein at least one of said layers comprises the material of claim 6.

9. A quantum well structure laser element including a cladding layer and an active layer, wherein at least one of said layers comprises the material of claim 6.

10. A solid solution semiconductor laser element material having the general chemical formula $$Ca_{1-x}Pb_xS_{1-z}Se_z$$

wherein $0<x\leq0.4$ and $0\leq z<1$.

11. A laser element including a cladding layer and an active layer, wherein at least one of said layers comprises the material of claim 10.

12. A double hetero junction laser element including a cladding layer and an active layer, wherein at least one of said layers comprises the material of claim 10.

13. A quantum well structure laser element including a cladding layer and an active layer, wherein at least one of said layers comprises the material of claim 10.

14. A solid solution semiconductor laser element material having the general chemical formula $$Ca_{1-x}(Pb_{1-y}Mn_y)_xS$$

wherein $0<x\leq0.5$ and $0\leq y<1$.

15. A laser element including a cladding layer and an active layer, wherein at least one of said layers comprises the material of claim 14.

16. A double hetero junction laser element including a cladding layer and an active layer, wherein at least one of said layers comprises the material of claim 14.

17. A quantum well structure laser element including a cladding layer and an active layer, wherein at least one of said layers comprises the material of claim 14.

* * * * *